United States Patent [19]

McRoberts

[11] Patent Number: 4,819,205

[45] Date of Patent: Apr. 4, 1989

[54] MEMORY SYSTEM HAVING MEMORY ELEMENTS INDEPENDENTLY DEFINED AS BEING ON-LINE OR OFF-LINE

[75] Inventor: Louis A. McRoberts, Scottsdale, Ariz.

[73] Assignee: Motorola, Inc., Schaumburg, Ill.

[21] Appl. No.: 715,718

[22] Filed: Mar. 25, 1985

[51] Int. Cl.[4] .......................................... G11G 19/08
[52] U.S. Cl. ........................................ 365/1; 365/200; 371/10
[58] Field of Search ............... 365/1, 15, 200; 371/10, 371/8

[56] References Cited

U.S. PATENT DOCUMENTS

| T100,402 | 3/1981 | Gindi et al. | 365/15 |
|---|---|---|---|
| 4,007,452 | 2/1977 | Hoff, Jr. | 365/200 |
| 4,225,941 | 9/1980 | Moran | 364/900 |
| 4,308,593 | 12/1981 | Young et al. | 365/1 |
| 4,354,253 | 10/1982 | Naden | 365/15 |
| 4,458,334 | 7/1984 | Hall | 365/1 |
| 4,584,673 | 4/1986 | Kuijk | 365/1 |
| 4,616,310 | 10/1986 | Dill et al. | 365/189 |

Primary Examiner—James W. Moffitt
Attorney, Agent, or Firm—Frank J. Bogacz

[57] ABSTRACT

A memory system containing redundant portions for the achievement of high reliability is disclosed. A total of n memory elements are utilized, but only m of the n memory elements may be on-line at any one time. On-line and off-line status of each of the n memory elements is defined independently from all other memory elements. Parity or hamming code error detection data associated with an external data bus are changed to cyclical code error detection data for storage in the memory system.

15 Claims, 4 Drawing Sheets

| TIME PERIOD | 90' COUNTER OUT | 92' RAM DATA OUT |
|---|---|---|
| $T_0$ | 7 | 24 |
| $T_1$ | 6 | 1 |
| $T_2$ | 5 | 3 |
| $T_3$ | 4 | 6 |
| $T_4$ | 3 | 20 |
| $T_5$ | 2 | 15 |
| $T_6$ | 1 | 7 |
| $T_7$ | 0 | 12 |
| $T_8$ | 7 | 24 |
| $T_9$ | 6 | 1 |
| $T_{10}$ | 5 | 3 |
| $T_{11}$ | 4 | 6 |
| $T_{12}$ | 3 | 20 |
| $T_{13}$ | 2 | 15 |
| $T_{14}$ | 1 | 7 |
| $T_{15}$ | 0 | 12 |

MEMORY SYSTEM HAVING MEMORY ELEMENTS INDEPENDENTLY DEFINED AS BEING ON-LINE OR OFF-LINE

STATEMENT OF GOVERNMENT INTEREST

The Government has rights in this invention pursuant to Contract No. AF04701-83-C-0025 awarded by the U.S. Air Force.

BACKGROUND OF THE INVENTION

This invention relates to memory systems which may be used in memory applications requiring high reliability. Specifically, the present invention relates to memory systems which utilize more memory elements than are needed to achieve the memory application's capacity requirements. More specifically, the present invention contains memory elements which may be brought "on-line" individually to permit the memory system to remain operational when failures occur.

The present invention provides a solution to a reliability problem. Reliability describes the likelihood of a component's failing within a given period of time under given operating conditions. It is well known in the art that duplication of memory elements can improve overall memory system reliability. However, inefficient duplication efforts fail to achieve as high a reliability as is possible given constraints of size, weight, or power.

On the other hand, the use of fewer parts typically raises overall system reliability because unused parts cannot fail. Therefore, an efficient utilization of memory elements permits the use of a fewer number of memory elements and raises system reliability. In addition, fewer parts require less power, and generate less heat. The power and heat effects each produce reliability and cost benefits.

One technique which tends to efficiently utilize memory in a bubble memory system having a plurality of bubble memory devices is described in U.S. Pat. No. 4,225,941 issued to Richard M. Moran. The Moran patent describes the use of a valid data memory external to the bubble devices. This valid data memory allows efficient utilization of bubble memory devices while preventing storage of data in blemished minor loops. While this technique tends to efficiently utilize bubble memory, it provides no memory element redundancy. In other words, all memory elements contained in the memory system are on-line whenever the memory system is active. Accordingly, any single point failure which occurs in the memory system or any change in bubble characteristics which causes the definition of blemished minor loops to change causes the Moran memory system to experience a failure.

Other memory systems incorporate redundant memory elements but bring back-up and secondary memory elements on-line in banks. A bank consists of a plurality of memory elements, so a failure in any one of the memory elements causes the entire bank to exhibit a failure. While this bank selection technique is conceptually simple, it may lead to a particularly inefficient use of memory because a failure in only one memory element causes the entire bank to be declared defective. Furthermore, the efficiency as applies to volume occupied decreases as the memory capacity of individual memory elements increases. Thus, this technique may be particularly unsuitable in memory systems using bubble memory for the memory elements. More memory elements are required than may be necessary, and the system reliability is less than may otherwise be possible.

SUMMARY OF THE INVENTION

Accordingly, it is an object of the present invention to provide an improved highly reliable memory system by controlling the on-line and off-line status of memory elements.

Another object of the present invention concerns independently controlling the on-line and off-line status of memory elements rather than controlling status through the use of a banking scheme.

Yet another object of the present invention concerns providing an efficient error detection coding scheme which assures that checkbits are generated using error free data and that parity bits are generated before syndrome is generated.

The above and other objects and advantages of the present invention are carried out in one form by a memory system containing n memory elements. The n memory elements include m on-line memory elements and k off-line memory elements. The number m reflects the memory capacity and data transfer rate requirements of the memory system and the number k in conjunction with the number n reflects the reliability requirements. A data router couples to all of the n memory elements. Additionally, an access controller couples to the data router and defines each one of the n memory elements as being on-line and off-line independently from all other n memory elements.

BRIEF DESCRIPTION OF THE DRAWINGS

A more complete understanding of the present invention may be derived by reference to the detailed description and claims when considered in connection with the accompanying drawings, wherein:

DETAILED DESCRIPTION OF THE PREFERRED EMBODIMENTS

Figure 1:
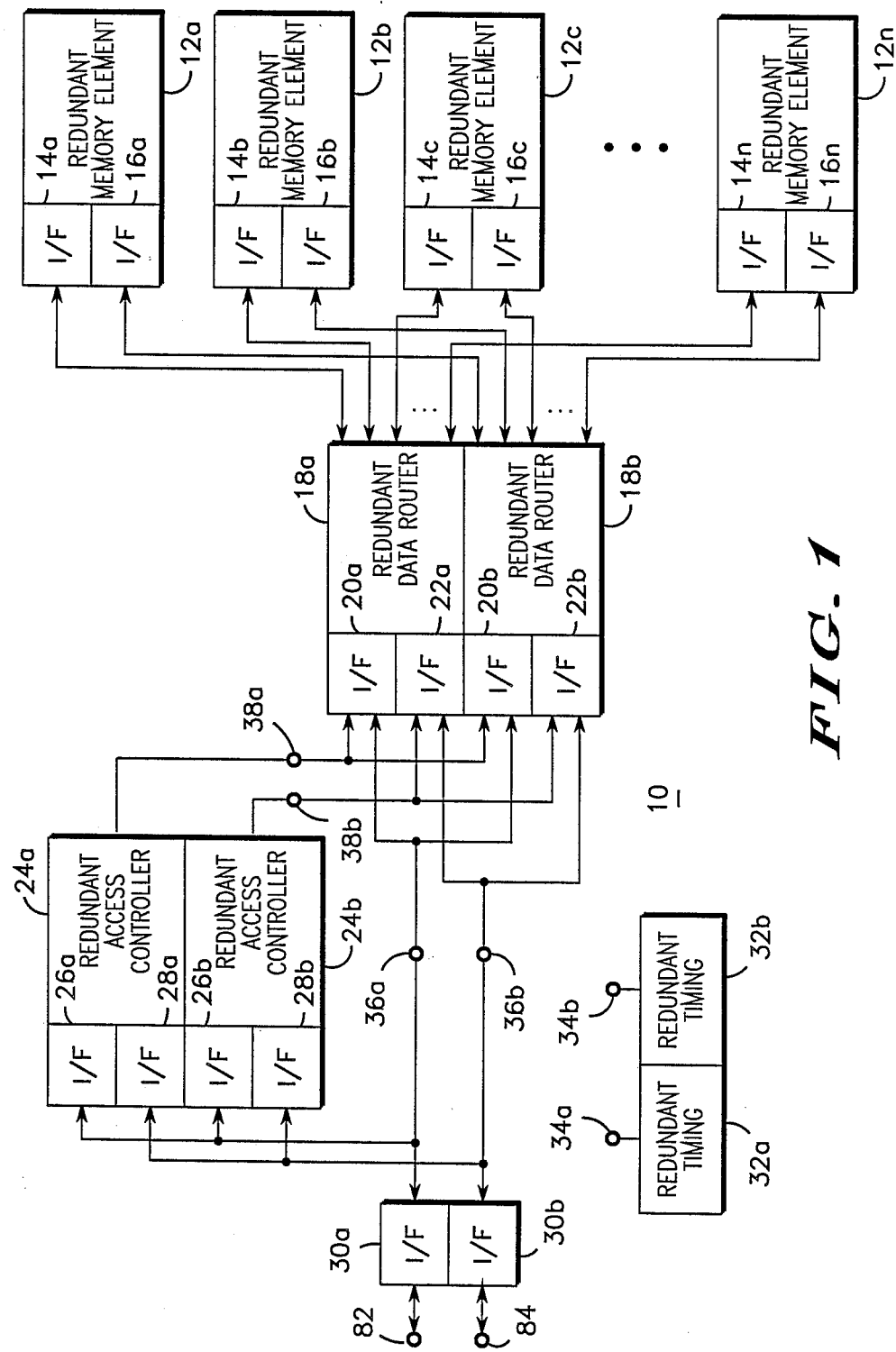
FIG. 1 shows a block diagram of a first embodiment of the present invention.

FIG. 1 shows a block diagram of one embodiment of the present invention wherein external data buses are applied at terminals 82 and 84. Each of the data buses may represent parallel input-output data buses containing an arbitrary number of bits. In this particular embodiment the external data buses applied at terminals 82 and 84 represent redundant data buses wherein substantially equivalent data may be transferred on either bus.

Terminal 82 connects to an input of interface 30a, and terminal 84 connects to an input of an interface 30b. An output of interface 30a connects to an internal data bus 36a, and an output of interface 30b connects to an internal data bus 36b. Thus, interface 30a couples the external data bus applied at terminal 82 to internal data bus 36a and vice-versa. Likewise, interface 30b couples the external data bus applied at terminal 84 to internal data bus 36b and vice-versa. Internal data buses 36a and 36b may represent redundant parallel data buses corresponding to the external data buses applied at terminal 82 and 84, respectively.

Internal data bus 36a connects to an input of an interface 26a, an input of an interface 26b, an interface 20a, and an interface 20b. Likewise, internal data bus 36b connects to an input of an interface 28a, an input of an interface 28b, an interface 22a, and an interface 22b. Outputs of interfaces 26a and 28a couple to an input of an access controller 24a. Outputs of interfaces 26b and 28b couple to an input of an access controller 24b. Interfaces 20a and 22a couple to a data router 18a. Additionally, interfaces 20b and 22b couple to a data router 18b. An output of access controller 24a connects to an access controller bus 38a and to inputs of interfaces 20a and 20b. Likewise, an output of access controller 24b connects to access controller bus 38b and to inputs of interfaces 22a and 22b.

Interfaces 26a and 26b selectively couple internal data bus 36a to access controllers 24a and 24b, respectively. Interfaces 28a and 28b selectively couple internal data bus 36b to access controllers 24a and 24b, respectively. Interfaces 20a and 20b selectively couple internal data bus 36a and access controller bus 38a to data routers 18a and 18b, respectively. Additionally, interfaces 22a and 22b selectively couple internal data bus 36b and access controller data bus 38b to data routers 18a and 18b, respectively. Accordingly, access controllers 24a and 24b may receive controlling inputs from either internal data bus 36a or 36b. Likewise, data routers 18a and 18b may receive controlling inputs from internal data bus 36a and access controller bus 38a. Alternatively, data routers 18a and 18b may receive controlling inputs from internal data bus 36b and access controller bus 38b.

Data routers 18a and 18b provide data for storage in memory elements 12a through 12n and receive data from memory elements 12a through 12n. The providing and receiving of data occurs at a plurality of internal data ports of data routers 18a and 18b. Thus, a first internal data port of data router 18a connects to interface 14a. In a similar manner, second and third through nth data router internal data ports connect to interfaces 14b and 14c through 14n, respectively. A first internal data port of data router 18b connects to an interface 16a. Similarly, second and third through nth internal data ports of data router 18b connect to interfaces 16b and 16c through 16n, respectively. Interfaces 14a, 14b, and 14c through 14n couple to memory elements 12a, 12b, and 12c, through 12n, respectively. Interfaces 16a, 16b, and 16c through 16n also couple to memory elements 12a, 12b and 12c through 12n, respectively. Interfaces 14 selectively couple internal data ports from data router 18a to memory elements 12, and interfaces 16 selectively couple internal data ports of data router 18b to memory elements 12. Thus, memory elements 12 may transfer data to and from either data router 18a or data router 18b.

Redundant timing sections 32a and 32b are shown as having outputs which connect to timing buses 34a and 34b, respectively. Although not specifically shown in FIG. 1, timing buses 34a and 34b may couple to any functional section (block) of memory system 10 shown in FIG. 1 to provide timing and control signals and to aid the reading of data from and the writing of data to memory elements 12.

A single point failure in any section of memory system 10 does not cause memory system 10 to exhibit a hard failure. For example, a failure at the input of interface 16b or the corresponding internal data port of data router 18b does not inhibit the storage and retrieval of data into and from memory element 12b because interface 14b and data router 18a may be used in transferring the data Similarly, a single failure in timing section 32a, data router 18a, or access controller 24a will not inhibit the proper operation of memory system 10 because timing section 32b, data router 18b, and access controller 24b, respectively, are available. Each functional block of memory system 10 redundant so that failures may be isolated rather than propagate through memory system 10.

In conjunction with the redundancy scheme of memory system 10, the present invention includes a quantity "n" of memory elements 12. Memory elements 12 may be bubble memories but are not limited to being bubble memories Of the n memory elements only a number "m" are on-line or activated at any given time. A number "k" of memory elements 12 are off-line or deactivated at any given time and the number m plus the number k equals the number n. No other relationship between the numbers m, k, and n exist.

The number m of on-line memory elements 12 reflects the memory system's capacity and data transfer rate requirements. Each of memory elements 12 exhibits a predetermined data capacity. The total data capacity for memory system 10 represents the sum of memory capacities for the m on-line memory elements 12.

Data may be written into and read from any m of memory elements 12 at a predetermined data transfer rate. If bubble memories represent memory elements 12, then the data transfer rate to and from any one of memory elements 12 may be m times the rate of a single memory element 12. Thus, the number m may be chosen to accommodate data transfer rate or memory capacity requirements of memory system 10.

In addition to the m on-line memory elements, the number k of off-line memory elements is chosen to achieve a desired reliability requirement of memory system 10. Each one of memory elements 12 has a reliability statistic associated therewith. The reliability statistic may be used to predict the likelihood of a memory element's 12 experiencing a failure within a given time interval and environmental condition. The overall reliability of memory system 10 decreases as the number of memory elements 12 which must simultaneously operate increases. However, reliability increases if memory elements can be provided which need not operate in order for memory system 10 to remain operational. Accordingly, off-line memory elements are provided so that they may be brought on-line and used in the event that an on-line memory element 12 experiences a failure. Resultingly, a failed memory element 12 need not properly operate in order for memory system 10 to continue operating, and thus reliability increases. The present invention can tolerate failures in any k of memory elements 12 and still remain operational.

Several techniques may be used to switch memory elements 12 between on-line and off-line states. In the present invention memory elements 12 which are in an on-line state may be written into and read from, while memory elements 12 in an off-line state may not be written into or read from. Thus, enable signals may be provided to a memory element 12 which exhibits one logical state when the memory element 12 is on-line and an opposing logical state when the memory element 12 is off-line. Alternatively, power could be applied to on-line memory elements and removed from off-line memory elements.

In the present invention, each of memory elements 12 exhibits an on-line or off-line status independently from all other of memory elements 12. The independent control of memory elements 12 optimizes reliability for the given number n of memory elements and required m. Accordingly, if a failure occurs in any one of memory elements 12, only the one failed memory element 12 is brought off-line when a failure occurs. Access controllers 24 define which of memory elements 12 are on-line and which are off-line, as described below in connection with FIGS. 4 and 5.

Data routers 18a and 18b are redundant in the sense that either data router may be used to perform the same task. The functions performed by data router 18 include two tasks. A first task performed by data router 18 is the coupling or transmitting of data from internal data buses 36a or 36b to appropriate memory elements 12 with proper timing so that reading or writing operations occur at memory elements 12. Data router 18 performs a second function of changing error detection schemes as discussed below in conjunction with FIG. 3.

As discussed above, memory elements 12 may represent bubble memories, which receive data in a serial format. Furthermore, internal data buses 36a and 36b may represent parallel data buses. Thus, the coupling function of data router 18 causes the parallel data received on internal data bus 36a or 36b to be presented stream. Access controllers 24a and 24b provide a definition of which memory elements are on-line or off-line as data router 18 receives data from internal data bus 36a or 36b.

Figure 2:
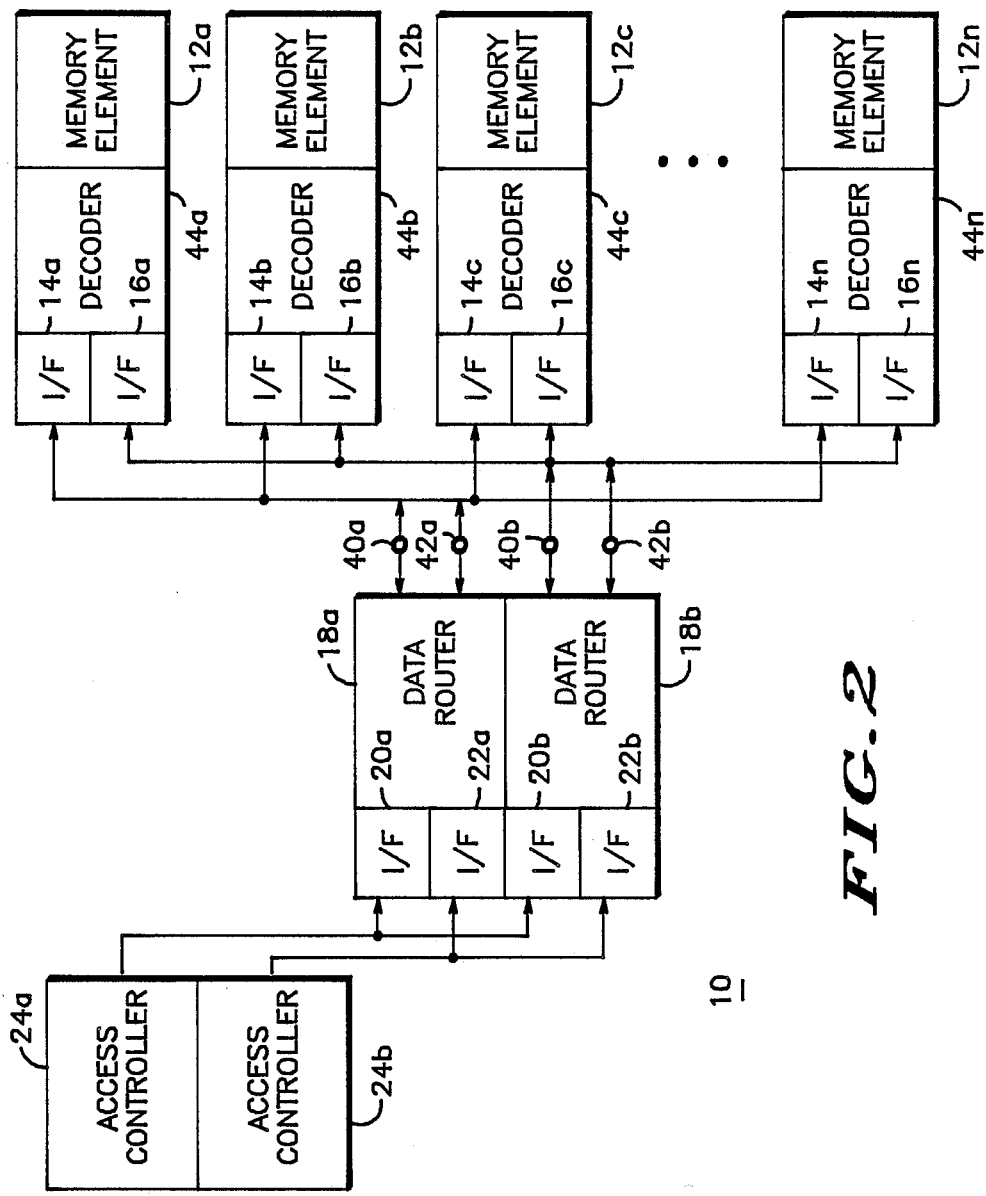
FIG. 2 shows a block diagram of a second embodiment of the present invention.

Referring to FIG. 2, a second embodiment of a memory system 10 according to the present invention is shown wherein sections similar to those described above in connection with FIG. 1 are referenced similarly. Accordingly, access controller 24a connects to interfaces 20a and 20b, and access controller 24b connects to interfaces 22a and 22b. Interfaces 20a and 22a couple to data router 18a, and interfaces 20b and 22b couple to data router 18b.

An address output of data router 18a connects to an address bus 40a and to interfaces 14a, 14b, and 14c through 14n. Likewise, an address output of data router 18b connects to an address bus 40b and to interfaces 16a, 16b, and 16c through 16n. A single internal data port of data router 18a connects to a line 42a and to interfaces 14a, 14b, and 14c through 14n. Additionally, a single internal data port of data router 18b connects to a line 42b and to interfaces 16a, 16b, and 16c through 16n. Outputs from interfaces 14a and 16a couple to decoder 44a, outputs from interfaces 14b and 16b couple to decoder 44b, and outputs of interfaces 14c and 16c through 14n and 16n couple to decoders 44c through 44n, respectively. Outputs from decoders 44a, 44b, and 44c through 44n couple to memory elements 12a, 12b, and 12c through 12n, respectively.

FIG. 1 described memory system 10 as containing n unique internal data ports for each of data routers 18. Each internal data port coupled to one and only one of memory elements 12. In contrast, FIG. 2 describes memory system 10 as containing only one internal data port for each of data routers 18, and an additional address bus associated with each of data routers 18. The net result is that the FIG. 2 embodiment of memory system 10 requires fewer conductors being output from data routers 18. For serial transmission of data between a data router 18 and memory elements 12 only a single, one-bit data port is needed. This single port requires only one conductor. Fewer conductors will result in a reliability improvement when the conductors must be routed through connectors before being connected to corresponding interfaces.

Another distinction between the FIG. 1 and FIG. 2 embodiments of memory system 10 is that the FIG. 2 embodiment includes a decoder 44 associated with each of memory elements 12. Decoders 44 receive either address bus 40a or 40b and permit access of a corresponding memory element 12 only when that memory element's address appears on a selected address bus 40. In other words, decoders 44 detect when data presented at an internal data port of a data router 18 relates to, or is intended for, their respective memory elements 12.

Figure 3:
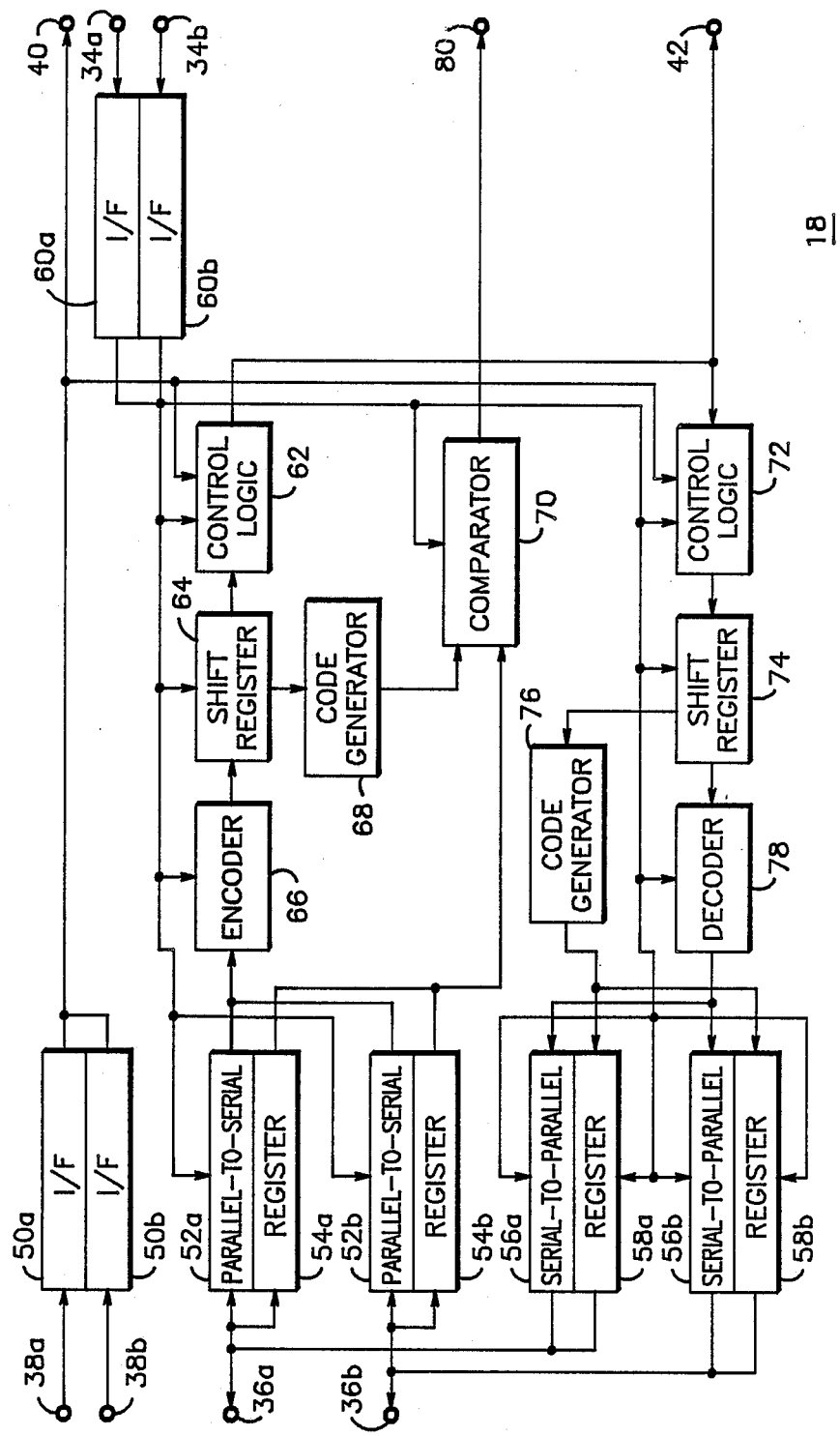
FIG. 3 shows a block diagram of a data router portion of the embodiment of the present invention depicted in FIG. 2.

FIG. 3 shows a particular embodiment of a data router 18 from the FIG. 2 embodiment of memory system 10. The FIG. 3 block diagram may represent either of data routers 18a or 18b because data routers 18 are redundant circuits for backup purposes.

Access controller bus 38a connects to an input of interface 50a, and access controller bus 38b connects to an input of interface 50b. Outputs from interfaces 50a and 50b connect together, to control logic 62, to control logic 72, and to address bus 40. Internal data bus 36a connects to parallel-to-serial converter 52a, register 54a, serial-to-parallel converter 56a, and register 58a. Likewise, internal data bus 36b connects to parallel-to-serial converter 52b, register 54b, serial-to-parallel converter 56b, and register 58b. Outputs from parallel-to-serial converter 52a and parallel-to-serial converter 52b connect together and to an input of encoder 66. An output from encoder 66 connects to an input of a shift register 64, and a serial output from shift register 64 connects to an input of control logic 62. A parallel output of shift register 64 connects to an input of code generator 68, and an output of code generator 68 connects to an input of comparator 70. Outputs of registers 54a and 54b connect together and to an input of comparator 70. An output of comparator 70 connects to terminal 80. An output from control logic 62 connects to internal data port 42, and to an input of control logic 72. An output from control logic 72 connects to an input of shift register 74, and a serial output of shift register 74 connects to an input of decoder 78. An output of decoder 78 connects to inputs of serial-to-parallel converters 56a and 56b. A parallel output from shift register 74 connects to an input of code generator 76, and an output from code generator 76 connects to inputs of registers 58a and 58b.

Timing bus 34a connects to an input of interface 60a and timing bus 34b connects to an input of interface 60b. Outputs of interfaces 60a and 60b connect together and to inputs of parallel-to-serial converters 52a and 52b, encoder 66, shift register 64, control logic 62, control logic 72, shift register 74, comparator 70, decoder 78, serial-to-parallel converters 56a and 56b, and registers 58a and 58b.

Interfaces 50a and 60a may represent portions of interface 20 as shown in FIGS. 1 and 2. Likewise, parallel-to-serial converter 52a, register 54a serial-to-parallel converter 56a, and register 58a may represent additional portions of interface 20 (See FIGS. 1 & 2). Additionally, interfaces 50b and 60b, parallel-to-serial converter 52b, register 54b, serial-to- parallel converter 56b, and register 58b may represent portions of interface 22 (See FIGS. 1 & 2). The present embodiment shows outputs of interfaces 50a and 50b connected together, outputs of interfaces 60a and 60b connected together, outputs of parallel-to-serial converters 52a and 52b connected together, outputs of registers 54a and 54b connected together. Thus, signals from either "a" or "b" buses may be used by data router 18. For example, access controller bus 38a is selected by enabling interface 50a and disabling interface 50b. Timing bus 34a is selected by enabling interface 60a and disabling interfaces 60b. Internal data bus 36a is selected by enabling parallel-to-serial converter 52a and register 54a while disabling parallel-to-serial converter 52b and register 54b. The connected together outputs suggest the use of three-state devices, but those skilled in the art will recognize that multiplexers and various digital logic gates may be utilized to achieve the same function. The enabling of particular ones of redundant buses may be provided from signals external to memory system 10. Alternatively, portions of the enabling signals may represent a portion of access controller buses 38.

The FIG. 3 embodiment of data router 18 assumes that an input write data stream received on internal data buses 36 for storage in memory elements 12 has input error detection data associated therewith. Such error detection data may utilize parity or Hamming code techniques. Parity and Hamming code data consume a relatively large portion of memory capacity if stored in memory, so the present invention switches error detection schemes to more efficiently utilize memory. Thus, encoder 66 is useful for generating intermediate error detection data, such as a cyclical code. An additional benefit of a cyclical code is that burst error correction capabilities are improved over parity and Hamming codes. Techniques for generating cyclical codes are known in the art and will not be discussed further here. However, the present invention utilizes a technique for switching between error detection schemes which insures data integrity.

An output from encoder 66 represents a serial stream of data which enters shift register 64. At an appropriate point in time, shift register 64 contains data identical to that entered into parallel-to-serial converter 52 from internal data bus 36. Code generator 68 follows the error detection coding scheme associated with data and stored in register 54. Thus, at an appropriate point in time the output from code generator 68 may be compared with the error detection bits stored in registers 54 to check whether an error has occurred. A signal from a timing bus 34 may indicate when this appropriate point in time occurs. The result of this comparison is presented at terminal 80.

The technique of checking the error detection code saved in register 54 after the check bits are generated in encoder 66 tends to insure that the check bits are generated from error free data. Accordingly, a check is made at comparator 70 which can catch any single bit error occurring within shift register 64, encoder 66, parallel-to-serial converter 52, or other devices prior to parallel-to-serial converter 52 in the data stream (not shown). This technique represents an improvement over memory systems which might have checked parity or Hamming codes prior to the generation of check bits. The data stream between such a prior occurring parity or Hamming check and the generation of check bits would not have had error detection data associated therewith. Thus, an error occurring in this area of the data stream could not have been detected, and the check bits could have been formed using invalid data.

Check bits generated by encoder 66 are inserted into an output write data stream at predetermined positions in time and saved in memory elements 12. For example, a memory system 10 using bubble memory for memory elements 12 may insert twelve check bits into the output write data stream immediately after the output of 512 data bits.

Control logic 62 presents the output write data stream from shift register 64 at internal data port 42 at appropriate times for writing into on-line memory elements as discussed above. Thus, control logic 62 operates in response to signals received from access controllers 24 (See FIGS. 1 & 2) either of interfaces 50a or 50b, and from timing buses 34 through interfaces 60a or 60b.

A read operation operates in a fashion complementary to the write operation described above. A serial input read data stream is received from on-line memory elements 12 at internal data Port 42. Control logic 72, in response to signals output from access controllers 24 (see FIGS. 1 & 2); converts data received from memory elements 12 (see FIGS. 1 & 2) and presents this input read data stream in a proper format to shift register 74. At predetermined points in time, shift register 74 contains the data identical to that which will be output to internal data buses 36 from serial-to-parallel converters 56 as a result of the read operation. At this time, code generator 76 generates output error detection data, such as a parity or Hamming code, which is compatible with requirements of internal data buses 36a and 36b. The parity or Hamming data code is saved in registers 58a and 58b. The input read data stream passes through shift register 74 into decoder 78. At predetermined points in time decoder 78 checks input error detection data inserted into the input read data stream, such as the cyclical code which was previously saved with the data in memory elements 12 during a prior write operation. Error correction capabilities may be included while the data stream passes through decoder 78. An output read data stream, which represents the input read data stream without input error detection data inserted therein, is saved in serial-to-parallel converters 56a and 56b. At this point in time a data word reconstructed from data read from memory elements 12 and associated data error detection data may be presented to either internal data bus 36a or 36b by enabling serial-to-parallel converter 56a and register 58a, or serial-to-parallel converter 56b and register 58b, respectively. Additionally, another word may be reconstructed from memory elements 12.

Since code generator 76 encounters the data stream from a read operation before decoder 78 encounters the data stream, parity or Hamming code error detection data are generated prior to the checking of the cyclical code data in decoder 78. This technique insures that single bit errors which might occur within shift register 74, decoder 78, serial-to-parallel converters 56, and other devices after serial-to-parallel converters 56 in the data stream will not go undetected. The technique of generating parity or Hamming code data in code generator 76 before the data stream encounters decoder 78 represents an improvement over memory systems which generate parity or Hamming codes after the generation of syndrome in a decoder. The data stream between such a decoder and an after-occurring parity or Hamming code generation would not have had error detection data associated therewith. Thus, an error occurring in this area of the data stream could not have been detected, and the parity or Hamming code bits could have been formed using invalid data.

Figures 4, 5:
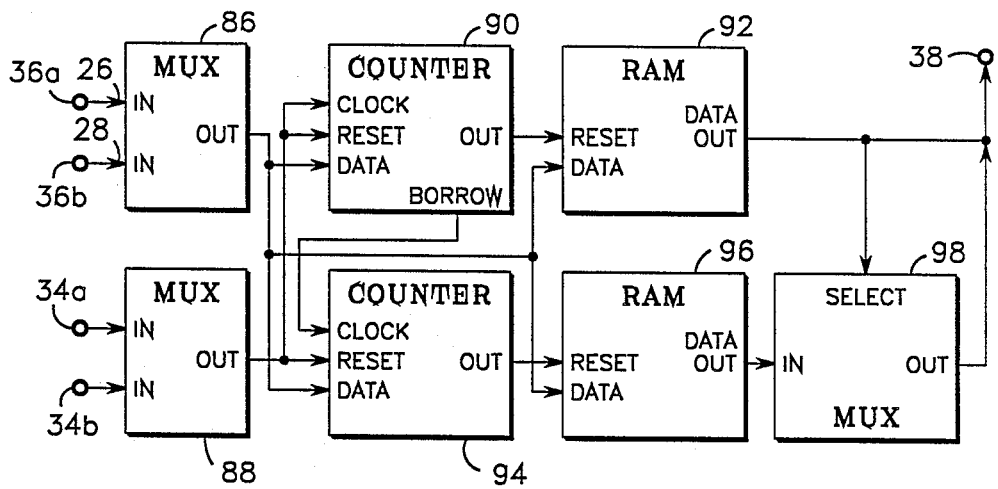
FIG. 4 shows a block diagram of an access controller portion of the present invention.
FIG. 5 shows a table of data output from counter and RAM portions of the FIG. 4 access controller in a hypothetical situation.

Referring to FIG. 4, a block diagram of either one of access controllers 24 is shown. In FIG. 4 a multiplexer 86 has a first input connected to internal data bus 36a and a second input connected to internal data bus 36b. The first input of multiplexer 86 may represent interface 26 and the second input may represent interface 28 as shown in FIG. 1. An output of multiplexer 86 connects to data inputs of a counter 90, a random access memory (RAM) 92, a counter 94, and a RAM 96.

A multiplexer 88 has a first input connected to timing bus 34a and a second input connected to timing bus 34b. An output from multiplexer 88 represents a timing bus having lines connected to reset inputs of counters 90 and 94 and a clock input of counter 90. A borrow output of counter 90 connects to a clock input of counter 94. An output of counter 90 connects to an address input of RAM 92, and an output of counter 94 connects to an address input of RAM 96. An output of RAM 92 connects to a select input of a multiplexer 98 and forms a portion of access controller bus 38. An output of RAM 96 connects to inputs of multiplexer 98, and an output from multiplexer forms another portion of access controller bus 38.

Multiplexer 86 selects one of two redundant internal data buses for the operation of access controller 24. Likewise, multiplexer 88 selects one of two redundant timing buses to control counters 90 and 94. The selection signals (not shown) may be applied from outside of memory system 10.

Data is written into RAM 92 by first selecting desired internal data and timing buses to be routed through multiplexers 86 and 88. Next a RAM address is loaded into counter 90 using the data input of counter 90. With the address input of RAM 92 presented from counter 90, data may be presented to the data input of RAM 92 through multiplexer 86 for a write operation. A write operation is performed with RAM 96 in a similar manner using counter 94.

A read operation from RAM 92 occurs by causing counter 90 to count in a manner synchronous with the operation of data router 18 and memory elements 12 (see FIGS. 1–3). FIG. 5 shows an example of counter 90 operating in such a synchronous manner. The FIG. 5 table shows only a hypothetical situation where the number m of on-line memory elements 12 equals eight, the number n of memory elements 12 is twenty-four, and a data word to be written into or read from memory elements 12 contains sixteen bits, not including error detection data. Accordingly, counter 90 may have a five bit output, and RAM 92 may be 24 words of 5 bits each in capacity. FIG. 5 further assumes that all relevant minor loops within memory elements 12 are valid loops. This hypothetical situation is chosen merely to teach the present invention and is not intended to limit its scope.

The table shown in FIG. 5 is divided into sixteen time periods ($T_0$-$T_{15}$) corresponding to the sixteen data bits. One data bit is routed to or from a memory element 12 within data router 18 during each time period. During time period $T_0$ counter 90 outputs a value of 7 to the address input of RAM 92 as shown in column 90'. RAM 92 contains data which defines which of the twenty-four memory elements are on-line and which are off-line. In this embodiment the data represents addresses identifying the on-line memory elements. Thus, at address 7 of RAM 92 the value read equals 24, as shown in column 92'. This value of 24 is presented to data router 18 through access controller bus 38. Data router 18 interprets the value of 24 to mean that bit 0 of the data word needs to be routed to memory element 24, or a memory element having a unique address of 24.

During time period $T_1$ counter 90 counts to a value of 6, RAM 92 outputs a value of 1 from address 6, and data router 18 routes data bit 1 to memory element 1. In a similar manner, during time periods $T_2$-$T_7$ counter 90 counts between values of 5 and 0 inclusive, RAM 92 outputs values of 3, 6, 20, 15, 7, and 12, respectively, and data router 18 routes data bits 2–7 to memory elements 3, 6, 20, 15, 7, and 12, respectively.

The sum of time periods $T_0$-$T_7$ may represent the time period required to transfer one bit of data between a data router 18 and one memory element 12. Thus, in time period $T_8$ another bit of data may again be transferred between data router 18 and the memory element 12 having an address of 24. Counter 90 reloads a value of 7 in time period $T_8$, and the process described above for time period $T_0$-$T_7$ repeats in time periods $T_8$-$T_{15}$. At the end of time period $T_{15}$ the complete 16 bits of data have been transferred between the 8 on-line memory elements 12 and data router 18. Additionally, data router 18 is ready to handle another 16 bit data word.

The data stored in RAM 92 may be stored in any order. However, the order of stored data will determine the order of accessing memory elements 12. A memory element may be brought off-line by overwriting a corresponding RAM 92 location with the address of a memory element which is to be brought on-line. For example, the memory element 12 having an address of 15 may be brought off-line by writing a value of 9 into RAM 92 address location 2. In this situation the memory element 12 having an address of 9 is brought on-line.

In the FIG. 4 embodiment of access controller 24, RAM 96 is included to further insure efficient packing of data into memory elements 12 when memory elements 12 comprise bubble memory devices. Bubble memories are characterized as having a predetermined number of minor-loops. Some of the minor loops may be blemished and thus cannot be used for the storage of data. Accordingly, RAM 96 represents an array of memory n bits wide, where n is the total number of memory elements, by the predetermined number of minor loops in a bubble memory element 12. A bit in RAM 96 may be set or reset in response to the blemished or unblemished state of every minor loop in every bubble memory device in memory system 10. Counter 94 provides an address to RAM 96 which reflects a particular minor loop into or from which a bit oi data may be transferred. Multiplexer 98 provides a single bit output which reflects the state of a particular minor-loop in a particular bubble memory element 12 whose address is being output from RAM 92. In a manner known in the art, blemished minor-loops of one bubble memory device may be by-passed without needing to by-pass unblemished minor-loops of other bubble memory devices.

The foregoing description uses various embodiments to illustrate the present invention. However, those skilled in the art will recognize that changes and modifications may be made in these embodiments without departing from the scope of the present invention. For example, the embodiments described herein depict various buses as being combination input and output buses. Those skilled in the art will recognize that such buses may alternatively be configured as separate input and output buses. Furthermore, although access controller 24, data router 18, timing sections 32, and various interface portions of the present invention are shown as being dual sections, those skilled in the art will recognize that various reliability requirements may permit single sections or may require more than two of the sections. Alternatively, for the purpose of teaching the present invention the FIG. 3 embodiment describes similar sections oi data router 18 as being separate sections applicable to either read or write operations. However, those skilled in the art will recognize that both read and write operations could utilize substantially the same circuitry. Further, access controller 24 need not require RAM memory devices when decoders are associated with each of memory elements 12. Thus, in some applications a counter which counts to a value of n may be used to provide addresses of memory elements. These and other modifications obvious to those skilled in the art are intended to be included within the scope of this invention.

What is claimed is:

1. A memory system having predetermined reliability, capacity, and data transfer rate requirements, said memory system comprising:
    a predetermined number n of memory elements said n memory elements containing a predetermined number m of on-line memory elements wherein the number m reflects the memory capacity and data transfer rate requirements, and containing a predetermined number k of off-line memory elements wherein the number k in conjunction with the number n reflects the memory system reliability requirement;
    a data router being coupled via a plurality of memory interfaces to all of said memory elements, said memory interfaces corresponding to said memory elements, said data router including n internal ports, each internal port coupled to a corresponding memory element via said corresponding memory interface so that each said memory element is coupled to only one of said n internal ports through said corresponding memory interface;
    said data router further including: an input for receiving an input write data stream; an output for supplying an output write data stream; and an encoder coupled between said data router input and output for the generation of intermediate error detection data so that the intermediate error detection data are inserted into the input write data stream at predetermined positions therein to produce the output write data stream; and
    an access controller coupled to said data router via a plurality of router interfaces, said access controller indicating each one of said memory elements as being on-line or off-line independently from all other ones of said memory elements.

2. A memory system as claimed in claim 1 wherein the input write data stream is supplied to said data router from an input data bus and has input error detection data associated therewith, and wherein said data router additionally comprises a comparator having first and second inputs, said comparator first input being coupled to said data router input so that the input error detection data are received at the first comparator input and said comparator second input being coupled to an input of said encoder, said comparator being for verifying that said encoder operates on error free data.

3. A memory system as claimed in claim 1 wherein said data router comprises n single bit wide internal ports coupled to said n memory elements for serial transmission of data between said data router and said memory elements.

4. A memory system as claimed in claim 1 wherein said data router comprises a redundant data router having a plurality of internal ports coupled to said memory elements, said redundant data router being configured so that each of said plurality of ports is capable of transferring substantially equivalent data.

5. A memory system as claimed in claim 4 wherein each of said plurality of ports of said redundant data router couples to all of said n memory elements.

6. A memory system as claimed in claim 4 additionally comprising n decoders wherein each one of said n decoders couples to one and only one of said n memory elements, said decoders being for detecting when data appearing at the internal ports of said data router relate to respective memory elements.

7. A memory system as claimed in claim 1 wherein said n memory elements comprise n bubble memory devices, respectively.

8. A memory system as claimed in claim 1 wherein said data router further comprises:
    an input for receiving an input read data stream having input error detection data inserted therein;
    an output for supplying an output data stream; and
    a decoder indirectly coupled between said data router input and said data router output for the generation of intermediate error detection data so that the intermediate error detection data are compared with the input error detection data in checking for errors in the input read data stream.

9. A memory system as claimed in claim 8 wherein the output read data stream has output error detection data associated therewith, and wherein said data router additionally comprises a code generator having an input indirectly coupled to said data router input and having an output indirectly coupled to said data router output, said code generator being for the generation of the output error detection data so that the output error detection data are generated from data that can be verified as being error free.

10. A method of implementing a memory system having predetermined memory capacity, data transfer rate and reliability requirements, said method comprising the steps of:
    activating a predetermined number m of a predetermined number n of memory elements wherein the number m reflects the memory capacity and data transfer rate requirements, and the number n reflects the memory system reliability requirements;
    deactivating a predetermined number k of the predetermined number n of memory elements wherein the number k plus the number m equals the number n;
    coupling each of the n memory elements to a corresponding data port of a data router;
    routing data via said data router to and from said m of n memory elements activated in said activating step;
    said data routing step for a write operation including the steps of: receiving input error detection data; generating intermediate error detection data; and checking whether the input error detection data in said receiving step indicates an error, said checking occurring after the generation of intermediate error detection data in said generating step; and indicating each of said n memory elements as being activated or deactivated independently from all other of said n memory elements.

11. A method as claimed in claim 10 wherein said routing data step comprises the step of serially transmitting data to and from the n memory elements.

12. A method as claimed in claim 10 wherein said data routing step comprises the step of redundantly transmitting data to and from the n memory elements.

13. A method as claimed in claim 12 wherein said redundantly transmitting step comprises the steps of:

coupling one port of a data router to all of said n memory elements; and decoding for each of the n memory elements, when data presented at the data router port of said coupling one port step related to the memory element.

14. A method as claimed in claim 10 wherein said data routing step for a read operation includes the steps of:

receiving intermediate error detection data;

generating output error detection data; and checking whether the intermediate error detection data in said receiving step indicates an error, said checking occurring after the generation of output error detection data in said generating step.

15. A memory system having predetermined reliability, capacity, and data transfer rate requirements, said memory system comprising:

a predetermined number n of bubble memory devices, said n devices containing a predetermined number m of on-line devices wherein the number m reflects the memory capacity and data transfer rate requirements, and containing a predetermined number k of off-line devices wherein the number k in conjunction with the number n reflects the memory system reliability requirements;

an access controller for indicating each one of said memory devices as being on-line and off-line independently from all other ones of said memory devices; and a data router having an external data port, an internal data port, an address output, a decoder, and a code generator, wherein:

the external data port supplies output read data having external error detection data associated therewith, the internal data port represents a single bit port coupled to all of said n memory devices for the serial transmission of an internal data stream between said data router and said n memory devices, the internal data stream having intermediate error detection data inserted at predetermined positions therein;

the address output couples to said access controller and said n memory devices, said address output being for providing data which enables said n memory devices to detect whether portions of the internal data stream relate to respective memory devices, the decoder being indirectly coupled between the external and internal data ports, the decoder being for checking for errors occurring in the internal data stream and removing intermediate error detection data from said internal data stream, and the code generator being indirectly coupled to the decoder and to the internal data port, the code generator being for generating the external error detection data so that errors occurring in the decoder are detectable.

* * * * *